US012804860B2

(12) United States Patent
Fu et al.

(10) Patent No.: US 12,804,860 B2
(45) Date of Patent: Nov. 17, 2026

(54) COOLING SYSTEM AND COOLING METHOD FOR CONTROLLING COOLING SYSTEM

(71) Applicant: Fulian Precision Electronics (Tianjin) Co., LTD., Tianjin (CN)

(72) Inventors: Yen-Chun Fu, New Taipei (TW); Tze-Chern Mao, New Taipei (TW); Chao-Ke Wei, New Taipei (TW); Chih-Hung Chang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 104 days.

(21) Appl. No.: 18/987,049

(22) Filed: Dec. 19, 2024

(65) Prior Publication Data

US 2025/0133704 A1 Apr. 24, 2025

Related U.S. Application Data

(62) Division of application No. 17/148,831, filed on Jan. 14, 2021, now Pat. No. 12,232,301.

(30) Foreign Application Priority Data

Jun. 28, 2020 (CN) ........................ 202010600949.0

(51) Int. Cl.
*H05K 7/20* (2006.01)
*F24F 110/10* (2018.01)
(Continued)

(52) U.S. Cl.
CPC ..... *H05K 7/20836* (2013.01); *H05K 7/20763* (2013.01); *F24F 2110/10* (2018.01);
(Continued)

(58) Field of Classification Search
CPC ............ H05K 7/20836; H05K 7/29763; F25D 17/02; F25D 3/00; F28B 9/06
(Continued)

(56) References Cited

U.S. PATENT DOCUMENTS 8,223,495 B1 * 7/2012 Carlson ..................... F28B 9/06 361/752
9,408,333 B2 8/2016 Aso et al.
(Continued)

FOREIGN PATENT DOCUMENTS

CN 101563574 A 10/2009

*Primary Examiner* — Joel M Attey
(74) *Attorney, Agent, or Firm* — ScienBiziP, P.C.

(57) ABSTRACT

A cooling method for controlling a cooling system to cool a data center, the cooling system includes a chiller unit, a cooling tower, and at least one cooling water storage tank, the method includes determining whether the cooling system is under a first condition, a second condition, or a third condition; when the cooling system is under the first condition, controlling the chiller unit to provide cooling water to the data center; when the cooling system is under the second condition, controlling the chiller unit to provide cooling water to the data center and the at least one cooling water storage tank; and when the cooling system is under the third condition, controlling the at least one cooling water storage tank to provide cooling water to the data center and the chiller unit to refill cooling water to the at least one cooling water storage tank.

8 Claims, 11 Drawing Sheets

α

(51) Int. Cl.
*F25D 3/00* (2006.01)
*F25D 17/02* (2006.01)
*F28B 9/06* (2006.01)

(52) U.S. Cl.
CPC ................ *F25D 3/00* (2013.01); *F25D 17/02* (2013.01); *F28B 9/06* (2013.01); *H05K 7/20218* (2013.01)

(58) Field of Classification Search
USPC ......................................................... 165/80.4
See application file for complete search history.

(56) References Cited

U.S. PATENT DOCUMENTS

| | | | | |
|---|---|---|---|---|
| 2008/0141703 | A1 | 6/2008 | Bean, Jr. | |
| 2011/0154842 | A1* | 6/2011 | Heydari ............. | H05K 7/20836 165/104.33 |
| 2011/0225997 | A1 | 9/2011 | Gast, Jr. et al. | |
| 2013/0167560 | A1 | 7/2013 | Wong et al. | |
| 2013/0232994 | A1* | 9/2013 | Bean, Jr. ................. | F25D 17/02 62/3.2 |
| 2016/0178448 | A1 | 6/2016 | Mella | |
| 2019/0301752 | A1* | 10/2019 | Horie ........................ | F24F 1/00 |

* cited by examiner

COOLING SYSTEM AND COOLING METHOD FOR CONTROLLING COOLING SYSTEM

CROSS-REFERENCE TO RELATED APPLICATIONS

This application is a divisional application of U.S. application Ser. No. 17/148,831 filed on Jan. 14, 2021.

FIELD

The subject matter herein generally relates to a cooling system and a cooling method for controlling the cooling system.

BACKGROUND

Generally, the continuity and stability of a cooling system are important for cooling a data center. When power is turned off, the cooling system cannot cool the data center.

BRIEF DESCRIPTION OF THE DRAWINGS

Implementations of the present disclosure will now be described, by way of embodiments, with reference to the attached figures.

DETAILED DESCRIPTION

Figure 1:
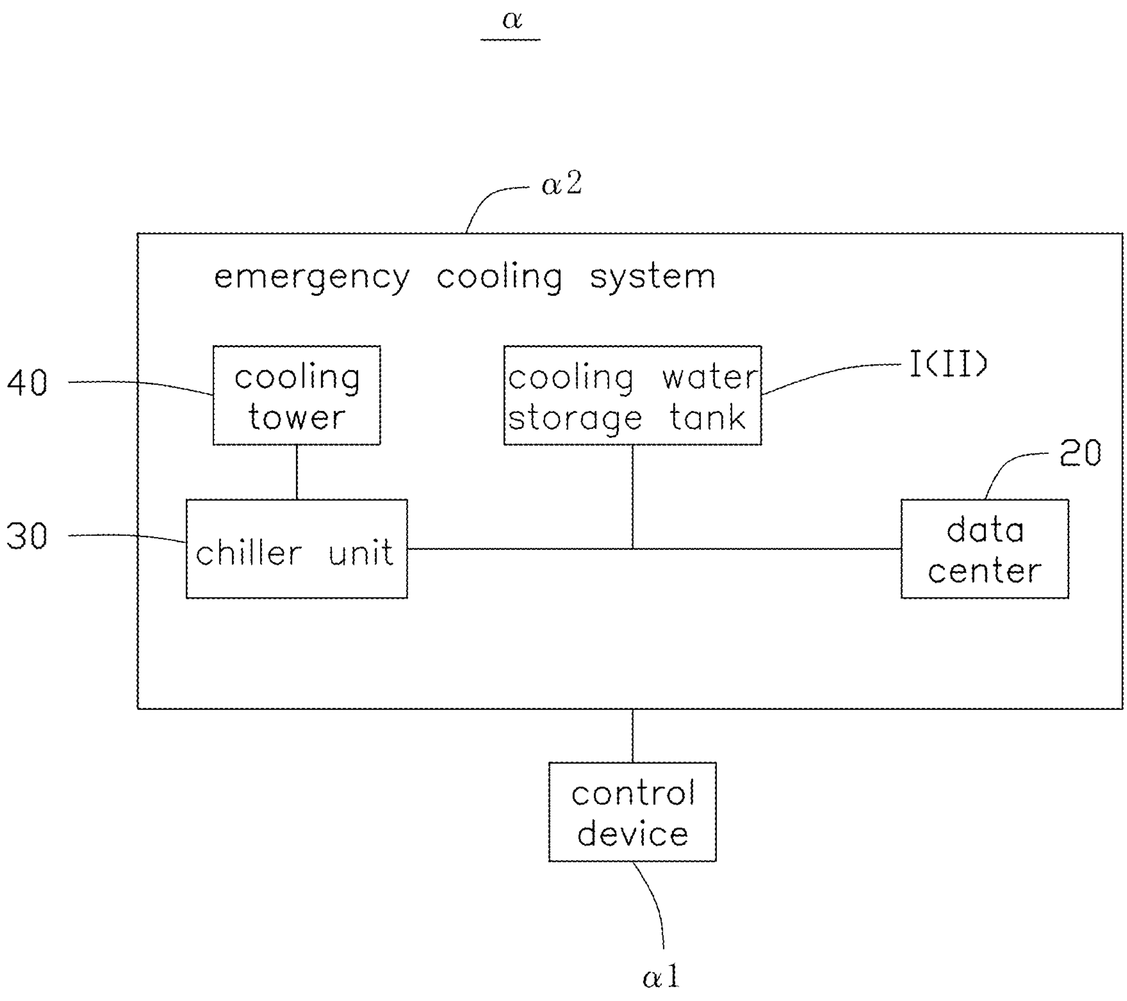
FIG. 1 is a schematic block diagram of a cooling system according to an embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
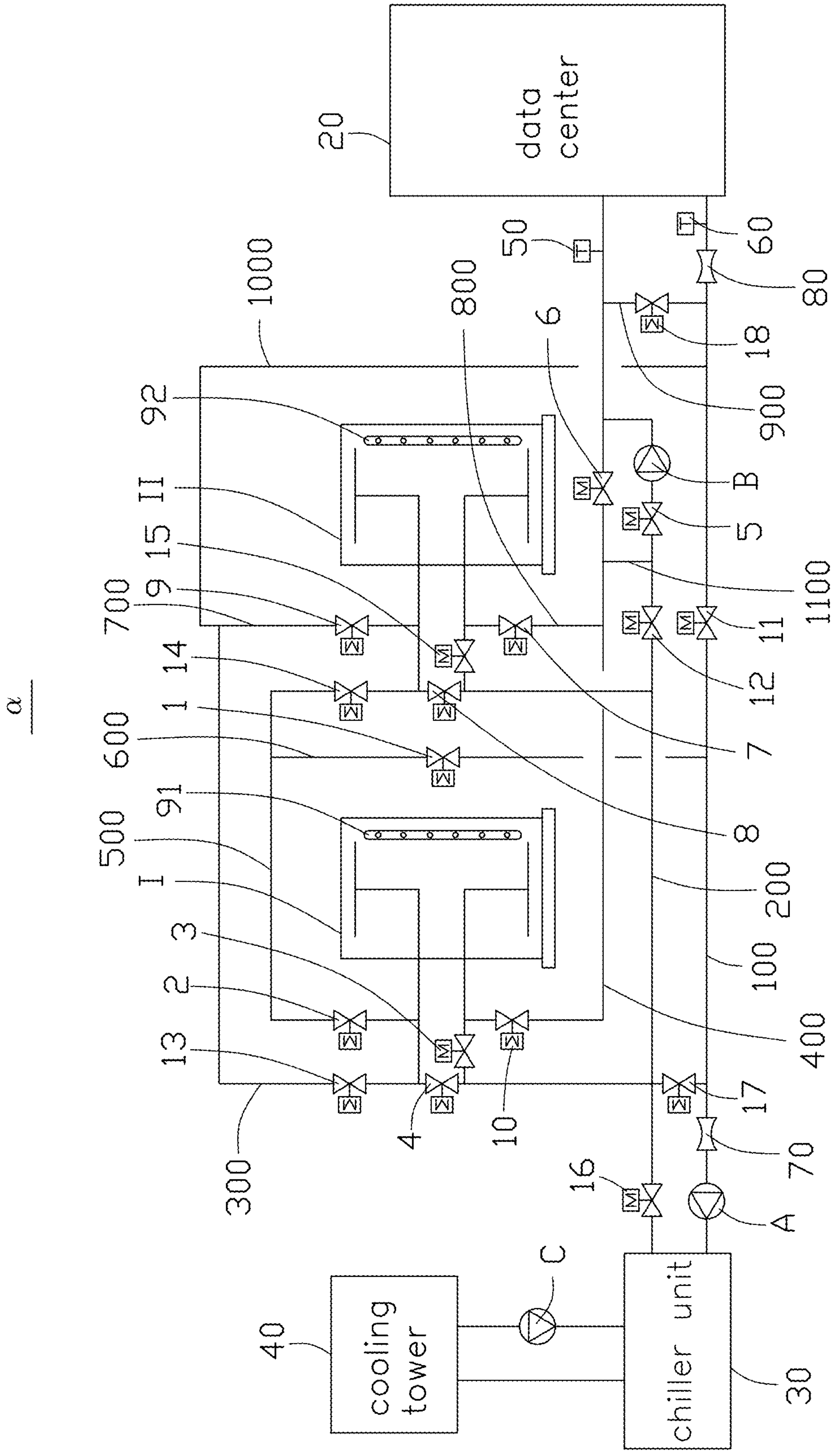
FIG. 2 is a schematic diagram of a pipeline of the cooling system.

Referring to FIGS. 1 and 2, an embodiment of a cooling system α includes a control device α1 and an emergency cooling system α2. The emergency cooling system α2 includes a first cooling water storage tank I, a second cooling water storage tank II, a data center 20, a chiller unit 30, and a cooling tower 40. The first cooling water storage tank I and the second cooling water storage tank II are used to store ice water and alternately provide ice water to the data center 20. An inlet and an outlet of the first cooling water storage tank I and the second cooling water storage tank II communicate with each other through a pipeline. The inlet and the outlet of the first cooling water storage tank I and the second cooling water storage tank II are respectively connected to an inlet and an outlet of the chiller unit 30 and the data center 20 through a pipeline. The cooling tower 40 is connected to the chiller unit 30 for removing waste heat of the chiller unit 30 and cooling the high temperature water in the chiller unit 30 to normal temperature.

A first pump A is provided at the inlet of the chiller unit 30. A second pump B is provided at the inlet of the data center 20. A third pump C is provided at the outlet of the cooling tower 40. The inlet of the data center 20 is provided with a temperature sensor 50, and the outlet of the data center 20 is provided with a temperature sensor 60. The inlet of the chiller unit 30 is provided with a flow sensor 70, and the outlet of the data center 20 is provided with a flow sensor 80. The temperature sensors 50, 60 and flow sensors 70, 80 are used to determine whether a load of the data center 20 reaches a set load. The first cooling water storage tank I is provided with a multipoint thermometer 91, and the second cooling water storage tank II is provided with a multipoint thermometer 92. The multipoint thermometers 91, 92 are used to measure the temperature at different levels to determine whether the overall water temperature has reached a set water temperature.

In one embodiment, the cooling system α includes a plurality of pipelines.

A first pipeline 100 connects the inlet of the chiller unit 30 and the outlet of the data center 20;

A second pipeline 200 connects the outlet of the chiller unit 30 and the inlet of the data center 20;

A third pipeline 300 connects the outlet and the inlet of the first cooling water storage tank I, and connects the outlet and the inlet of the first cooling water storage tank I to the inlet and the outlet of the chiller unit 30, respectively;

A fourth pipeline 400 connects the outlet of the first cooling water storage tank I to the inlet of the data center 20 and to the second pipeline 200;

A fifth pipeline 500 connects the inlet of the first cooling water storage tank I to the second pipeline 200, and connects the inlet and the outlet of the second cooling water storage tank II;

A sixth pipeline 600 connects the fifth pipeline 500 and the first pipeline 100;

A seventh pipeline 700 connects the inlet of the second cooling water storage tank II and the third pipeline 300;

An eighth pipeline 800 connects the outlet of the second cooling water storage tank II and the fourth pipeline 400;

A ninth pipeline 900 connects the inlet and the outlet of the data center 20;

A tenth pipeline 1000 connects the seventh pipeline 700 and the outlet of the data center 20;

An eleventh pipeline 1100 connects an intersection of the sixth pipeline 600 and the second pipeline 200 and an intersection of the second pipeline 200 and the fourth pipeline 400 for connecting the fourth pipeline 400 and the second pipeline 200.

In one embodiment, the control device α1 further includes a plurality of valves.

A first valve 1 is provided on the sixth pipeline 600.

A second valve 2 is provided on the fifth pipeline 500 and located between the sixth pipeline 600 and the third pipeline 300.

A third valve 3 is provided on the outlet of the first cooling water storage tank I and located between the fourth pipeline 400 and the third pipeline 300.

A fourth valve 4 is provided on the third pipeline 300 and located between the outlet and the inlet of the first cooling water storage tank I.

A fifth valve 5 is provided on the second pipeline 200 and located between the intersection of the eleventh pipeline 1100 and the second pipeline 200 and the intersection of the second pipeline 200 and the fourth pipeline 400.

A sixth valve 6 is provided on the fourth pipeline 400 and located between the intersection of the eleventh pipeline 1100 and the fourth pipeline 400 and the intersection of the second pipeline 200 and the fourth pipeline 400.

A seventh valve 7 is provided on the eighth pipeline 800.

An eighth valve 8 is provided on the fifth pipeline 500 and located between the outlet and the inlet of the second cooling water storage tank II.

A ninth valve 9 is provided on the seventh pipeline 700 and located between the inlet of the second cooling water storage tank II and the intersection of the tenth pipeline 1000 and the seventh pipeline 700.

A tenth valve 10 is provided on the fourth pipeline 400 and located between the outlet of the first cooling water storage tank I and the intersection of the fourth pipeline 400 and the eighth pipeline 800.

An eleventh valve 11 is provided on the first pipeline 100 and located at an intersection of the sixth pipeline 600, the tenth pipeline 1000, and the first pipeline 100.

A twelfth valve 12 is provided on the second pipeline 200 and located at an intersection of the fifth pipeline 500, the eleventh pipeline 1100, and the second pipeline 200.

A thirteenth valve 13 is provided on the seventh pipeline 700 and located between the intersection of the seventh pipeline 700 and the third pipeline 300 and the intersection of the seventh pipeline 700 and the tenth pipeline 1000.

A fourteenth valve 14 is provided on the fifth pipeline 500 and located between the intersection of the sixth pipeline 600 and the fifth pipeline 500 and the intersection of the inlet of the second cooling water storage tank II and the fifth pipeline 500.

A fifteenth valve 15 is provided at the inlet of the second cooling water storage tank II and located between the intersection of the eighth pipeline 800 and the inlet of the second cooling water storage tank II and the intersection of the inlet of the second cooling water storage tank II and the fifth pipeline 500.

A sixteenth valve 16 is located at the outlet of the chiller unit 30.

A seventeenth valve 17 is provided on the third pipeline 300 and located between the inlet and the outlet of the chiller unit 30.

An eighteenth valve 18 is provided between the fourth pipeline 400 and the first pipeline 100 and located between the inlet and the outlet of the data center 20.

The first pump A is located at the inlet of the chiller unit 30.

The second pump B is provided on the second pipeline 200 and located between the intersection of the eleventh pipeline 1100 and the second pipeline 200 and the intersection of the second pipeline 200 and the fourth pipeline 400.

The third pump C is located at the outlet of the cooling tower 40.

Figure 3:
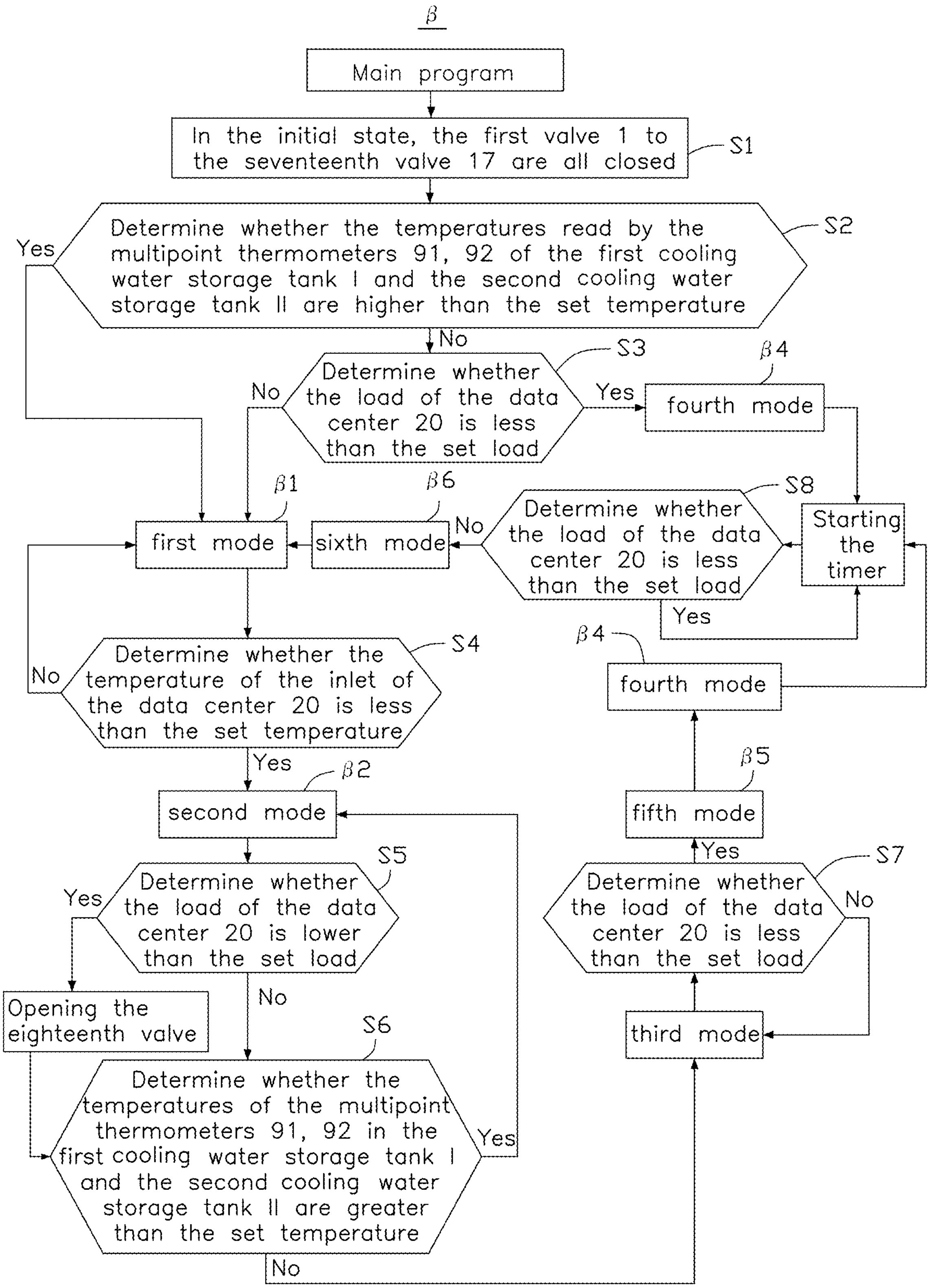
FIG. 3 is a flowchart of a cooling method.

FIG. 3 shows a cooling method β for controlling the cooling system α of the data center 20. In one embodiment, the cooling method β includes eight modes. The cooling method β is used to control the cooling system α to improve the stability of the cooling system α. Even when the power is turned off, the entire system can still maintain the cooling system α for a period of time (about 15-20 minutes) until power is restored. The eight modes of the cooling method β are described below.

In the first mode β1, the chiller unit 30 is controlled to directly supply cold water to the data center 20 when the cooling system α is initially started or when the load of the data center 20 suddenly increases.

In the second mode β2, the chiller unit 30 is controlled to supply cold water to the data center 20, the first cooling water storage tank I, and the second cooling water storage tank II at the same time.

In the third mode β3, operations of the data center 20, the first cooling water storage tank I, and the second cooling water storage tank II are maintained when the first cooling water storage tank I and the second cooling water storage tank II are filled.

In the fourth mode β4, the first cooling water storage tank I and the second cooling water storage tank II are controlled to alternately supply cold water to the data center 20, and the chiller unit 30 is controlled to refill the first cooling water storage tank I and the second cooling water storage tank II when the corresponding first cooling water storage tank I and the second cooling water storage tank II is empty.

In the fifth mode β5, the third mode β3 is switched to the fourth mode β4.

In the sixth mode β6, the fourth mode 4 is switched to the first mode β1.

In the seventh mode β7, the first cooling water storage tank I is repaired. Under the fourth mode β4, if the first cooling water storage tank I is abnormal, the seventh mode β7 is implemented for manual repair of the first cooling water storage tank I.

In the eighth mode β8, the second cooling water storage tank II is repaired. Under the fourth mode β4, if the second cooling water storage tank II is abnormal, the eighth mode β8 is implemented for manual repair of the second cooling water storage tank II.

In one embodiment, an execution method of the cooling method β includes:

S1: In the initial state, the first valve 1 to the seventeenth valve 17 are all closed;

S2: Determine whether the temperatures read by the multipoint thermometers 91, 92 of the first cooling water storage tank I and the second cooling water storage tank II are higher than the set temperature. If no, step three is implemented. If yes, the first mode β1 is implemented, and then step four is implemented;

S3: Determine whether the load of the data center 20 is less than the set load. If yes, the fourth mode β4 is implemented, and then a timer is started, and step 8 is implemented after timing. If no, the first mode β1 is implemented, and then step 4 is implemented;

S4: Determine whether the temperature of the inlet of the data center 20 is less than the set temperature. If no, the first mode β1 is maintained, and step 4 is repeated. If yes, the second mode β2 is implemented, and then step 4 is implemented.

S5: Determine whether the load of the data center 20 is lower than the set load. If yes, the eighteenth valve 18 is opened, and then step 6 is implemented. If no, then step six is implemented directly;

S6: Determine whether the temperatures of the multipoint thermometers 91, 92 in the first cooling water storage tank I and the second cooling water storage tank II are greater than the set temperature. If no, the third mode β3 is implemented, and then step 7 is implemented. If yes, the second mode β2 is maintained, and step five is repeated;

S7: Determine whether the load of the data center 20 is less than the set load. If yes, the fifth mode β5 is implemented, the third mode β3 is switched to the fourth mode β4, and then the timer is started, and then step 8 is implemented after timing. If no, the third mode β3 is maintained, and step seven is repeated;

S8: Determine whether the load of the data center 20 is less than the set load. If yes, the fourth mode β4 is maintained and step 8 is repeated. If no, the sixth mode β6 is implemented and the fourth mode β4 is switched to the first mode β1, then step three is repeated.

Figure 4:
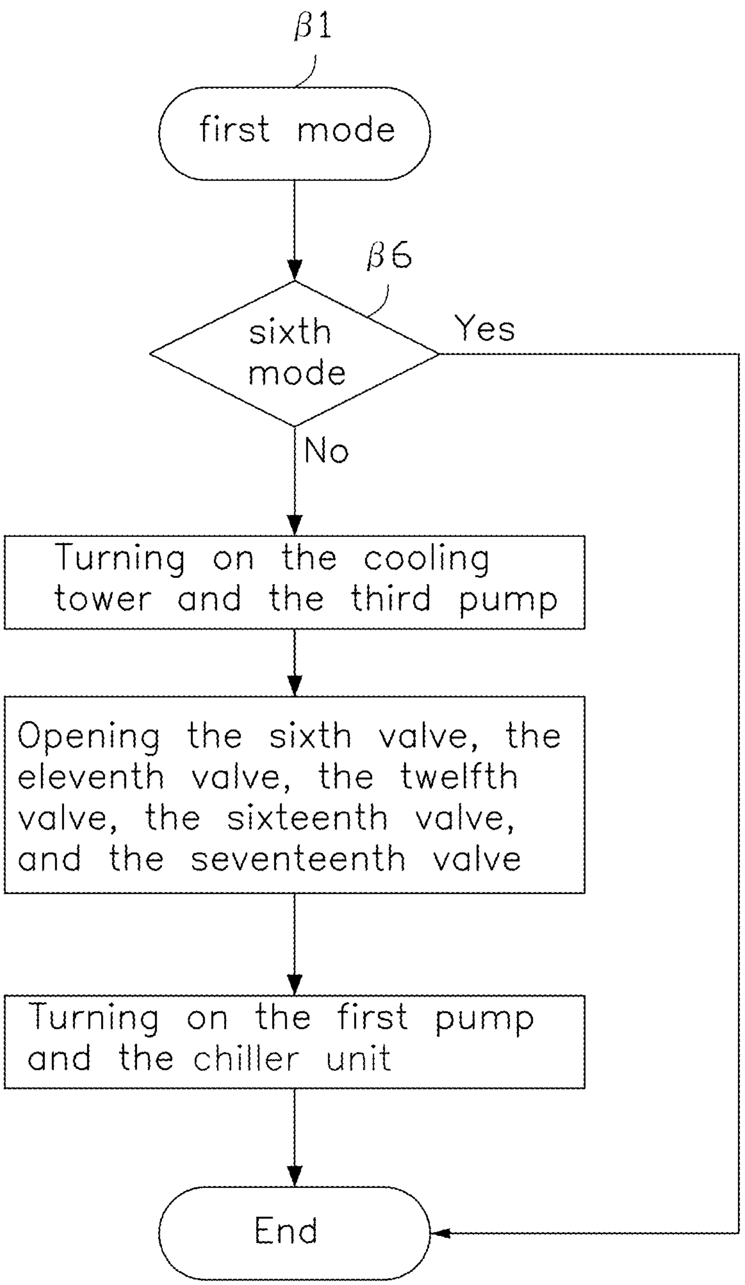
FIG. 4 is a flowchart of a first mode in FIG. 3.

FIG. 4 shows a working method of the first mode β1. The first mode β1 is implemented when the cooling system α is initially started or when the load of the data center 20 suddenly increases. The first mode β1 controls the chiller unit 30 to directly provide cold water to the data center 20. The steps of the first mode β1 include: determining whether a current mode is the sixth mode β6, and if yes, maintain the sixth mode β6; if no, first turn on the cooling tower 40 and the pump C, and after stabilization, then open the sixth valve 6, the eleventh valve 11, the twelfth valve 12, the sixteenth valve 16, and the seventeenth valve 17, and then after stabilization turn on the first pump A and the chiller unit 30.

Figure 5:
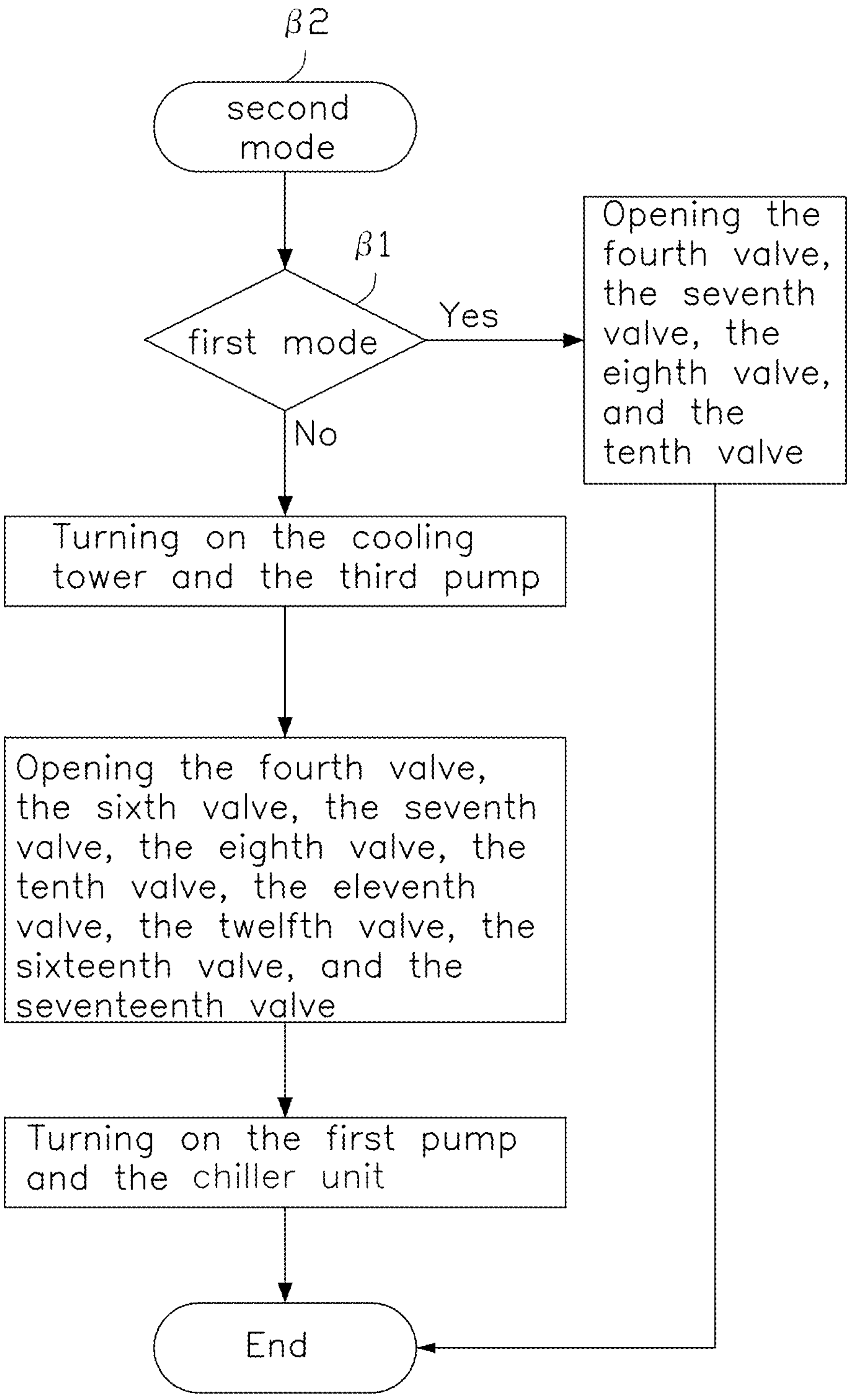
FIG. 5 is a flowchart of a second mode in FIG. 3.

FIG. 5 shows a working method of the second mode β2. The second mode β2 is implemented when the temperature of the first cooling water storage tank I and the second cooling water storage tank II is higher than the set temperature. The second mode β2 controls the chiller unit 30 to simultaneously cool the first cooling water storage tank I, the second cooling water storage tank II, and the data center 20. The steps of the second mode β2 are: determining whether a current mode is the first mode β1, if yes, the fourth valve 4, the seventh valve 7, the eighth valve 8, and the tenth valve 10 are opened; if no, the cooling tower 40 and the third pump C are turned on, and then after stabilization, the fourth valve 4, the sixth valve 6, the seventh valve 7, the eighth valve 8, the tenth valve 10, the eleventh valve 11, the twelfth valve 12, the sixteenth valve 16, and the seventeenth valve 17 are opened, and then after stabilization, the first pump A and the chiller unit 30 are turned one.

Figure 6:
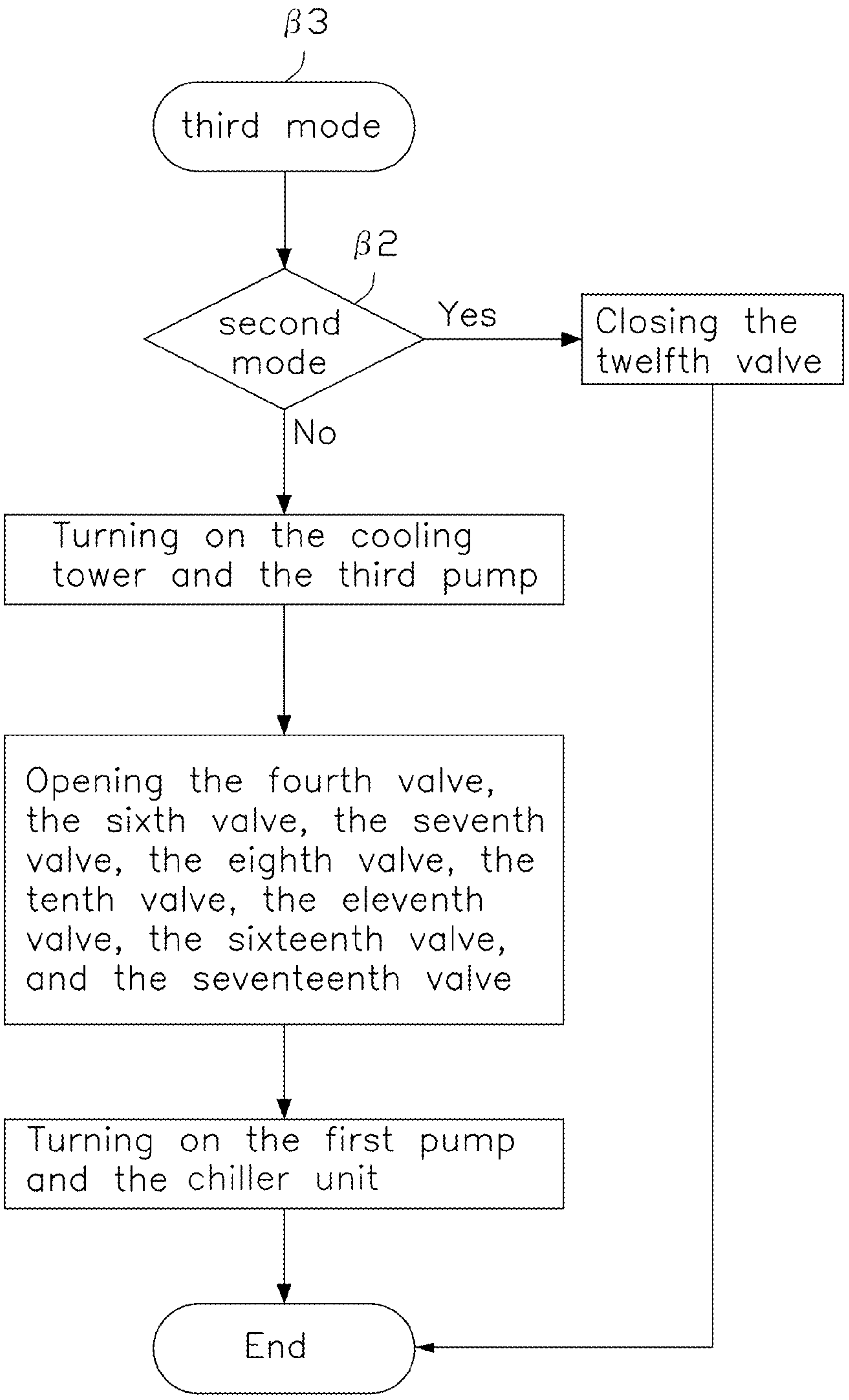
FIG. 6 is a flowchart of a third mode in FIG. 3.

FIG. 6 shows a working method of the third mode β3. The third mode β3 is implemented when the temperatures of the first cooling water storage tank I and the second cooling water storage tank II are below the set temperature, and operations of the data center 20, the first cooling water storage tank I, and the second cooling water storage tank II are maintained. The steps of the third mode β3 are: determining whether a current mode is the second mode β2, and if yes, the twelfth valve 12 is closed; if no, the cooling tower 40 and the third pump C are turned on, and then the fourth valve 4, the sixth valve 6, the seventh valve 7, the eighth valve 8, the tenth valve 10, the eleventh valve 11, the sixteenth valve 16, and the seventeenth valve 17 are opened, and then after stabilization, the first pump A and the chiller unit 30 are turned on.

Figure 7:
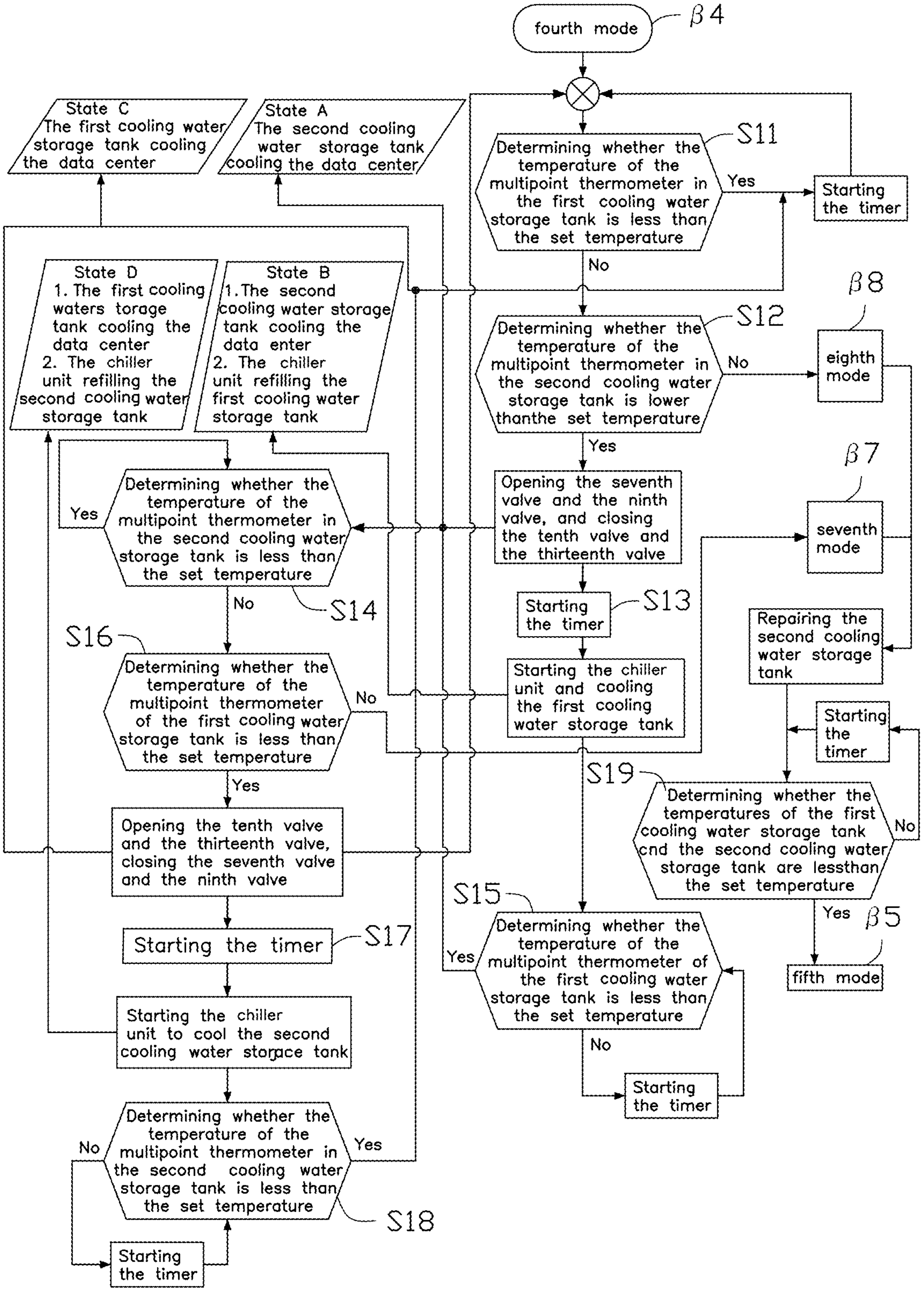
FIG. 7 is a flowchart of a fourth mode in FIG. 3.

FIG. 7 shows a working method of the fourth mode β4. The fourth mode β4 is implemented when the temperatures in the first cooling water storage tank I and the second cooling water storage tank II are below the set temperature. In the fourth mode β4, the cooling water of the first cooling water storage tank I will first be released to the data center 20. When the temperature of the first cooling water storage tank I is higher than the set temperature, the second cooling water storage tank II replaces the first cooling water storage tank I to release the cooling water, and the first cooling water storage tank I is filled by the chiller unit 30; when the temperature of the second cooling water storage tank II is higher than the set temperature, the first cooling water storage tank I replaces the second cooling water storage tank II to release the cooling water, and the second cooling water storage tank II is filled by the chiller unit 30. The fourth mode β4 includes four states:

State A: the second cooling water storage tank II provides cold water to the data center 20;

State B: the second cooling water storage tank II provides cold water to the data center 20, and the data center 20 cools the first cooling water storage tank I;

State C: the first cooling water storage tank I provides cold water to the data center 20;

State D: the first cooling water storage tank I provides cold water to the data center 20, and the data center 20 cools the second cooling water storage tank II.

The steps of the fourth mode β4 are:

S11: determining whether the temperature of the multipoint thermometer 91 in the first cooling water storage tank I is less than the set temperature. If yes, the first cooling water storage tank I continues to provide cold water to the data center 20 and enter the state C; if no, then step two is implemented;

S12: determining whether the temperature of the multipoint thermometer 92 in the second cooling water storage tank II is lower than the set temperature. If no, the eighth mode β8 is implemented to repair the second cooling water storage tank II (the second cooling water storage tank II has a problem and the temperature does not drop for a predetermined amount of time), and after inspection, step 9 is implemented; if yes, then the seventh valve 7 and the ninth valve 9 are opened, and the tenth valve 10 and the thirteenth valve 13 are closed. At this time, the second cooling water storage tank II provides cold water for the data center 20, so enter state A;

S13: starting the timer, and after the timer has finished starting the chiller unit 30 and cooling the first cooling water storage tank I. At this time, enter state B and implement step 5;

S14: determining whether the temperature of the multipoint thermometer 92 in the second cooling water storage tank II is less than the set temperature, and if yes, maintain step 4; if no, implement step 6;

S15: determining whether the temperature of the multipoint thermometer 91 is less than the set temperature. If no, maintain step 5; if yes, enter state A, and implement step 14 after stabilization;

S16: determining whether the temperature of the multipoint thermometer 91 is lower than the set temperature. If no, the seventh mode β7 is implemented to repair the first cooling water storage tank I (the first cooling water storage tank I has a problem and the temperature does not drop for a predetermined amount of time). After being repaired, step 9 is implemented; if yes, the tenth valve 10 and the thirteenth valve 13 are opened, and the seventh valve 7 and the ninth valve 9 are closed, and then the first cooling water storage tank I provides cold water to the data center 20, so enter state C, and step 7 is implemented after stabilization;

S17: starting the timer, and after the timer has finished starting the chiller unit 30 to cool the second cooling water storage tank II. At this time, enter state D, and step 8 is implemented after it stabilization;

S18: determining whether the temperature of the multipoint thermometer 92 is less than the set temperature. If no, step 8 is maintained; if yes, enter state C and implement step 1;

S19: determining whether the temperature of the multipoint thermometers 91, 92 are less than the set temperature. If no, maintain step 9; if yes, implement the fifth mode β5.

Figure 8:
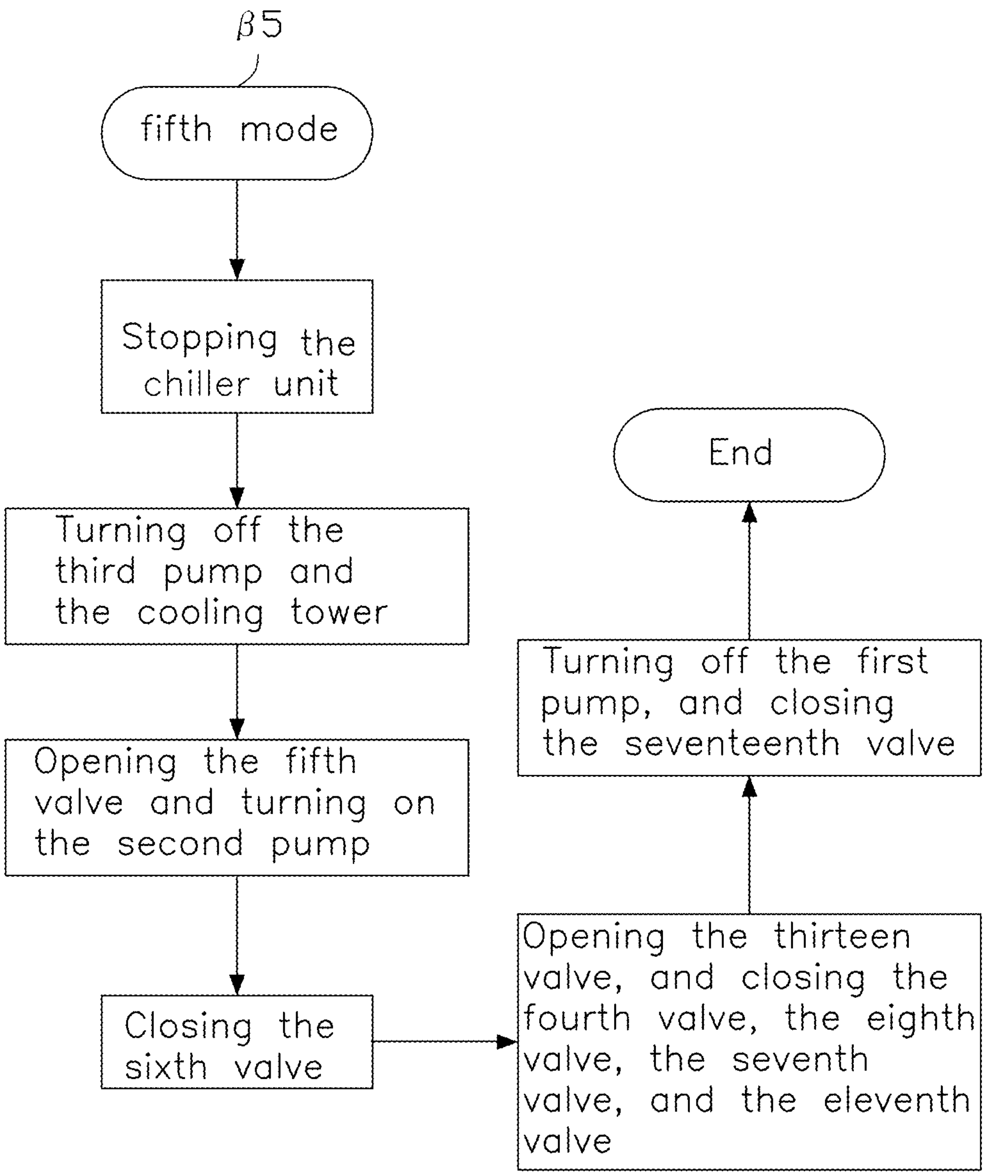
FIG. 8 is a flowchart of a fifth mode in FIG. 3.

FIG. 8 shows a working method of the fifth mode β5. The fifth mode β5 is used to switch the third mode β3 to the fourth mode β4. The steps of the fifth mode β5 are: the chiller unit 30 stops running, then after stabilization, the third pump C and the cooling tower 40 are turned off, then after stabilization, the fifth valve 5 is opened and the second pump B is turned on, then after stabilization the sixth valve 6 is closed, then after stabilization the thirteenth valve 13 is opened, and the fourth valve 4, the eighth valve 8, the seventh valve 7, and the eleventh valve 11 are closed. After stabilization, the first pump A is turned off, and the seventeenth valve 17 is closed.

Figure 9:
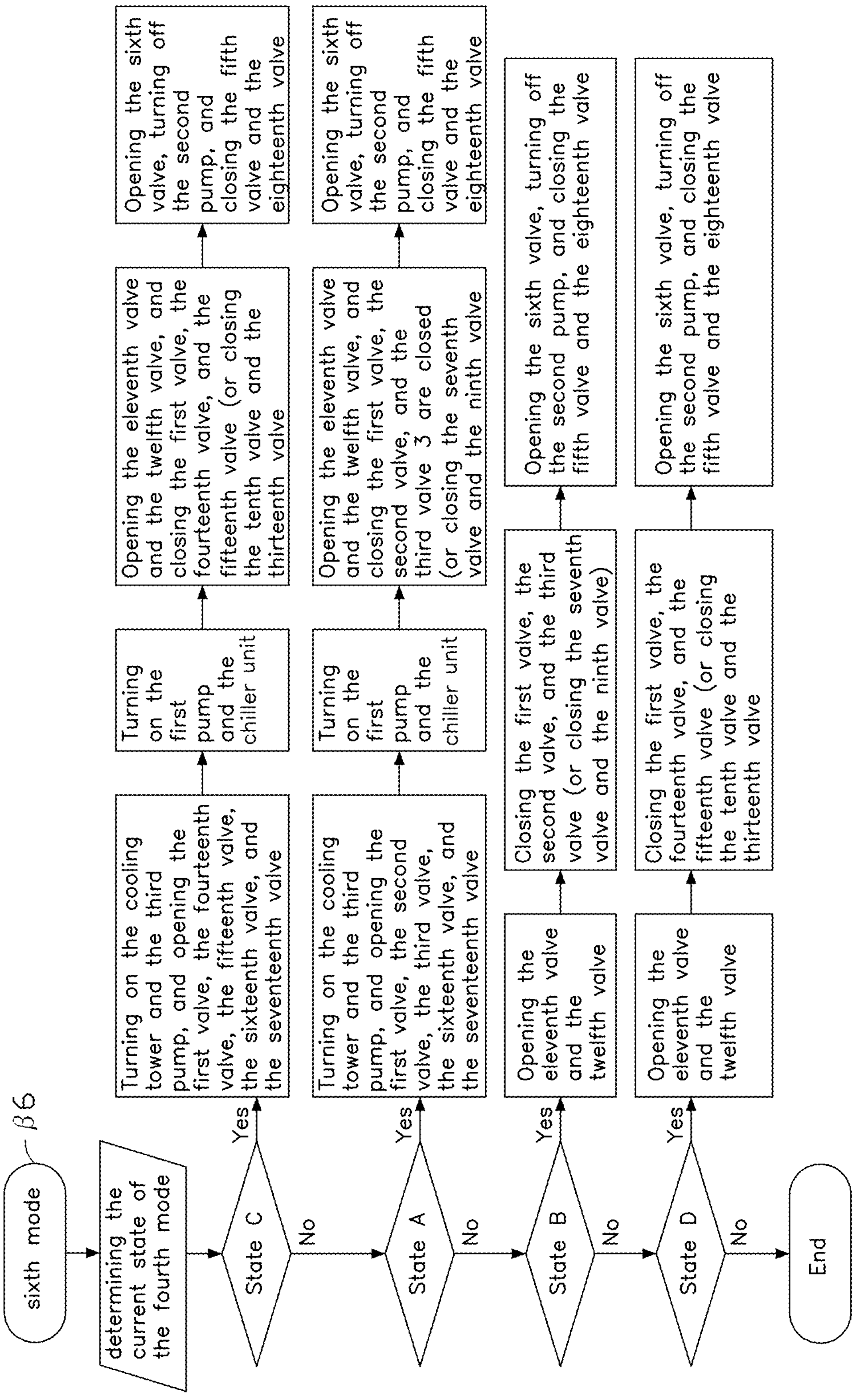
FIG. 9 is a flowchart of a sixth mode in FIG. 3.

FIG. 9 shows a working method of the sixth mode β6. The sixth mode β6 is used to switch the fourth mode β4 to the first mode β1. The steps of the sixth mode β6 are: determining the current state of the fourth mode β4;

If the current state is state A, the cooling tower 40 and the third pump C are turned on, and the first valve 1, the second valve 2, the third valve 3, the sixteenth valve 16, and the seventeenth valve 17 are turned on (for maintaining system stability to avoid temperature fluctuations in the second cooling water storage tank II); after stabilization, the first pump A and the chiller unit 30 are turned on; after stabilization, the eleventh valve 11 and the twelfth valve 12 are opened, and the first valve 1, the second valve 2, and the third valve 3 are closed (or the seventh valve 7 and the ninth valve 9 are closed); after stabilization, the sixth valve 6 is opened, the second pump B is turned off, and the fifth valve 5 and the eighteenth valve 18 are closed;

If the current state is state B, the eleventh valve 11 and the twelfth valve 12 are opened; after stabilization, the first valve 1, the second valve 2, and the third valve 3 are closed (or the seventh valve 7 and the ninth valve 9 are closed); after stabilization the sixth valve 6 is opened, the second pump B is turned off, and the fifth valve 5 and the eighteenth valve 18 are closed;

If the current state is state C, the cooling tower 40 and the third pump C are turned on, and the first valve 1, the fourteenth valve 14, the fifteenth valve 15, the sixteenth valve 16, the seventeenth valve 17 are opened (for maintain system stability and avoiding temperature fluctuations in the first cooling water storage tank I); after stabilization, the first pump A and the chiller unit 30 are turned on; after stabilization, the eleventh valve 11 and the twelfth valve 12 are opened, and the first valve 1, the fourteenth valve 14, and the fifteenth valve 15 are closed (or the tenth valve 10 and the thirteenth valve 13 are closed); after stabilization the sixth valve 6 is opened, the second pump B is turned off, and the fifth valve 5 and the eighteenth valve 18 are closed;

If the current state is state D, the eleventh valve 11 and the twelfth valve 12 are opened; after stabilization, the first valve 1, the fourteenth valve 14, and the fifteenth valve 15 are closed (or the tenth valve 10 and the thirteenth valve 13 are closed); after stabilization the sixth valve 6 is opened, the second pump B is turned off, and the fifth valve 5 and the eighteenth valve 18 are closed.

Figure 10:
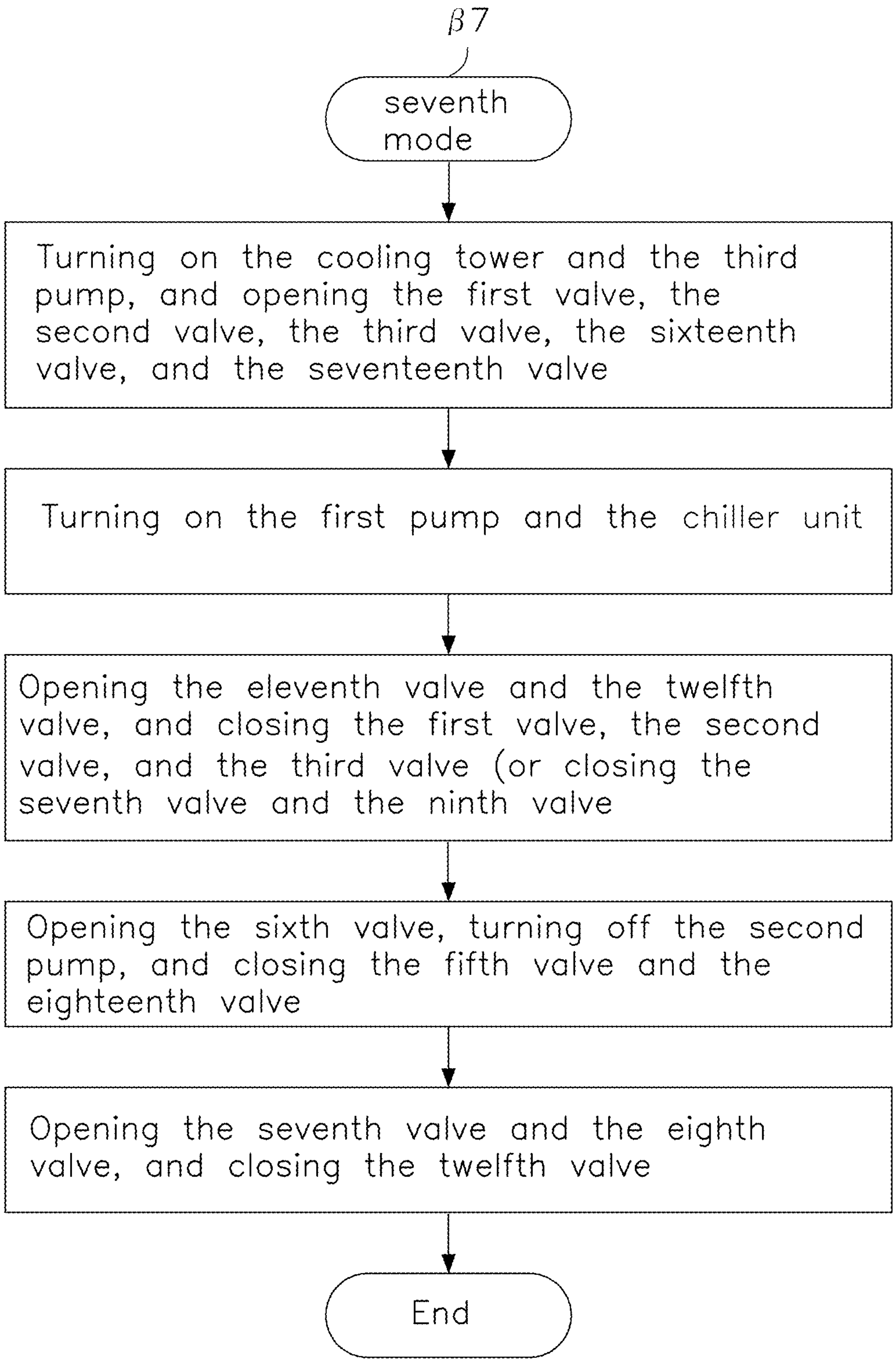
FIG. 10 is a flowchart of a seventh mode in FIG. 7.

FIG. 10 shows a working method of the seventh mode β7. In the fourth mode β4, if an abnormality occurs in the first cooling water storage tank I, the seventh mode β7 is implemented for repairing the first cooling water storage tank I. The steps of the seventh mode β7 are: turning on the cooling tower 40 and the third pump C, and opening the first valve 1, the second valve 2, the third valve 3, the sixteenth valve 16, and the seventeenth valve 17; after stabilization the first pump A and the chiller unit 30 are turned on; after stabilization the eleventh valve 11 and the twelfth valve 12 are opened, and the first valve 1, the second valve 2, and the third valve 3 are closed (or the seventh valve 7 and the ninth valve 9 are closed); after stabilization, the sixth valve 6 is opened, the second pump B is turned off, and the fifth valve 5 and the eighteenth valve 18 are closed; after stabilization, the seventh valve 7 and the eighth valve 8 are opened, and the twelfth valve 12 is closed.

Figure 11:
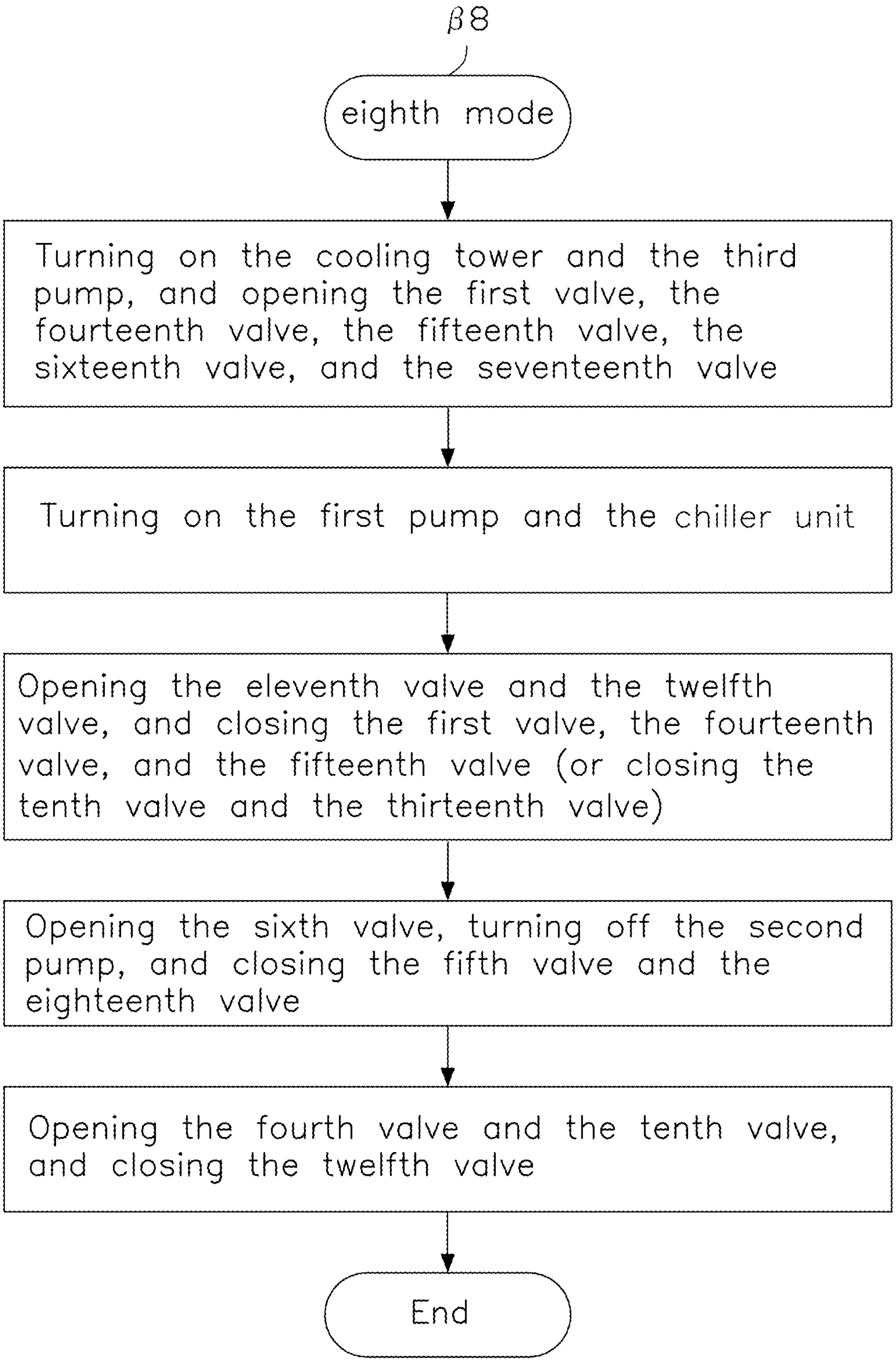
FIG. 11 is a flowchart of an eighth mode in FIG. 7.

FIG. 11 shows a working method of the eighth mode β8. In the fourth mode β4, if an abnormality occurs in the second cooling water storage tank II, the eighth mode β8 is implemented for repairing the second cooling water storage tank II. The steps of the eighth mode β8 are: turning on the cooling tower 40 and the third pump C, and opening the first valve 1, the fourteenth valve 14, the fifteenth valve 15, the sixteenth valve 16, and the seventeenth valve 17; after stabilization, the first pump A and the chiller unit 30 are turned on; after stabilization, the eleventh valve 11 and the twelfth valve 12 are opened, and the first valve 1, the fourteenth valve 14, and the fifteenth valve 15 are closed (or the tenth valve 10 and the thirteenth valve 13 are closed); after stabilization the sixth valve 6 is opened, the second pump B is turned off, and the fifth valve 5 and the eighteenth valve 18 are closed; after stabilization the fourth valve 4 and the tenth valve 10 are opened, and the twelfth valve 12 is closed.

It can be understood that, in other embodiments, there may be other numbers of cooling water storage tanks, and the number of valves, pumps, and multipoint thermometers needs to be increased accordingly. The data center 20 may also be another device that needs to be cooled.

Compared with the related art, the cooling system α and the cooling method β alternately cool the data center 20 through the chiller unit 30, the first cooling water storage tank I, and the second cooling water storage tank II. The cooling water storage tank I and the second cooling water storage tank II provide cold water to the data center 20, so as to maintain the operation of the data center 20 even when the power is shut off, thereby achieving the purpose of increasing the stability and continuity of the cooling system.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A cooling method for controlling a cooling system to cool a data center, the cooling system comprising a chiller unit, a cooling tower, and at least one cooling water storage tank, the method comprising:

determining whether the cooling system is under a first condition, a second condition, or a third condition;

when the cooling system is under the first condition, controlling the chiller unit to provide cooling water to the data center;

when the cooling system is under the second condition, controlling the chiller unit to provide cooling water to the data center and the at least one cooling water storage tank; and when the cooling system is under the third condition, controlling the at least one cooling water storage tank to provide cooling water to the data center and the chiller unit to refill cooling water to the at least one cooling water storage tank;

the at least one cooling water storage tank comprises a first cooling water storage tank and a second cooling water storage tank, in the first condition, controlling at least one of a plurality of valves to be opened to couple the chiller unit to the data center, and controlling at least one of a plurality of pumps to be turned on to cause the chiller unit to supply cooling water to the data center;

in the second condition, controlling some of the plurality of valves to be opened to couple the chiller unit to the first cooling water storage tank, the second cooling water storage tank, and the data center, and controlling some of the plurality of pumps to be turned on to cause the chiller unit to supply cooling water to the data center, the first cooling water storage tank, and the second cooling water storage tank at the same time;

in a third condition, controlling some of the plurality of valves to be opened to couple the chiller unit to the first cooling water storage tank, the second cooling water storage tank, and the data center, controlling at least one of the plurality of valves to be opened to couple the data center to the first cooling water storage tank and the second cooling water storage tank, and controlling some of the plurality of pumps to be turned on to cause the first cooling water storage tank and the second cooling water storage tank to alternately supply cooling water to the data center and to cause the chiller unit to refill cooling water to either the first cooling water storage tank or the second cooling water storage tank while the other one of the first cooling water storage tank and the second cooling water storage tank provides cooling water to the data center.

2. The cooling method of claim 1, wherein:

the first condition, the second condition, and the third condition are determined by detecting temperatures and a load of the data center and temperatures of the at least one cooling water storage tank.

3. The cooling method of claim 2, wherein:

the first condition is determined when the temperatures of the data center are greater than a set temperature and the load of the data center is greater than a set load;

the second condition is determined when the temperatures of the data center are less than the set temperature and the load of the data center is less than the set load, and the temperatures of the at least one cooling water storage tank are greater than the set temperature; and the third condition is determined when the temperatures of the at least one cooling water storage tank are less than the set temperature, and the load of the data center is less than the set load.

4. The cooling method of claim 3, wherein:

when the temperatures of the at least one cooling water storage tank remain greater than the set temperature for a predetermined amount of time, a pipeline of the at least one cooling water storage tank is closed off.

5. The cooling method of claim 4, further comprising:

providing the plurality of valves, the plurality of pumps, and a plurality of pipelines, the plurality of valves and the plurality of pumps being set on the plurality of pipelines, each of the first cooling water storage tank and the second cooling water storage tank being coupled to the data center and the chiller unit through the plurality of pipelines, providing a flow sensor at an outlet of the data center and an inlet of the chiller unit for sensing the load of the data center, providing a temperature sensor at each of an inlet of the data center and the outlet of the data center for sensing the temperature of the data center, providing a multipoint temperature sensor at each of the first cooling water storage tank and the second cooling storage tank.

6. The cooling method of claim 5, wherein providing the plurality of pipelines comprises:

providing a first pipeline coupling the inlet of the chiller unit and the outlet of the data center;

providing a second pipeline coupling an outlet of the chiller unit and the inlet of the data center;

providing a third pipeline coupling an outlet and an inlet of the first cooling water storage tank, and coupling an outlet and an inlet of the first cooling water storage tank to the inlet and the outlet of the chiller unit, respectively;

providing a fourth pipeline coupling the outlet of the first cooling water storage tank to the inlet of the data center and to the second pipeline;

providing a fifth pipeline coupling the inlet of the first cooling water storage tank to the second pipeline, and coupling the inlet and the outlet of the second cooling water storage tank;

providing a sixth pipeline coupling the fifth pipeline and the first pipeline;

providing a seventh pipeline coupling the inlet of the second cooling water storage tank and the third pipeline;

providing an eighth pipeline coupling the outlet of the second cooling water storage tank and the fourth pipeline;

providing a ninth pipeline coupling the inlet and the outlet of the data center;

providing a tenth pipeline coupling the seventh pipeline and the outlet of the data center; and providing an eleventh pipeline coupling an intersection of the sixth pipeline and the second pipeline and an intersection of the second pipeline and the fourth pipeline for coupling the fourth pipeline and the second pipeline.

7. The cooling method of claim 6, wherein providing the plurality of valves comprises:

providing a first valve on the sixth pipeline;

providing a second valve on the fifth pipeline and located between the sixth pipeline and the third pipeline;

providing a third valve on the outlet of the first cooling water storage tank and located between the fourth pipeline and the third pipeline;

providing a fourth valve on the third pipeline and located between the outlet and the inlet of the first cooling water storage tank;

providing a fifth valve on the second pipeline and located between the intersection of the eleventh pipeline and the second pipeline and the intersection of the second pipeline and the fourth pipeline;

providing a sixth valve on the fourth pipeline and located between the intersection of the eleventh pipeline and the fourth pipeline and the intersection of the second pipeline and the fourth pipeline;

providing a seventh valve on the eighth pipeline;

providing an eighth valve on the fifth pipeline and located between the outlet and the inlet of the second cooling water storage tank;

providing a ninth valve on the seventh pipeline and located between the inlet of the second cooling water storage tank and the intersection of the tenth pipeline and the seventh pipeline;

providing a tenth valve on the fourth pipeline and located between the outlet of the first cooling water storage tank and the intersection of the fourth pipeline and the eighth pipeline;

providing an eleventh valve on the first pipeline and located at an intersection of the sixth pipeline, the tenth pipeline, and the first pipeline;

providing a twelfth valve on the second pipeline and located at an intersection of the fifth pipeline, the eleventh pipeline, and the second pipeline;

providing a thirteenth valve on the seventh pipeline and located between the intersection of the seventh pipeline and the third pipeline and the intersection of the seventh pipeline and the tenth pipeline;

providing a fourteenth valve on the fifth pipeline and located between the intersection of the sixth pipeline and the fifth pipeline and the intersection of the inlet of the second cooling water storage tank and the fifth pipeline;

providing a fifteenth valve at the inlet of the second cooling water storage tank and located between the intersection of the eighth pipeline and the inlet of the second cooling water storage tank and the intersection of the inlet of the second cooling water storage tank and the fifth pipeline;

providing a sixteenth valve located at the outlet of the chiller unit;

providing a seventeenth valve on the third pipeline and located between the inlet and the outlet of the chiller unit; and providing an eighteenth valve between the fourth pipeline and the first pipeline and located between the inlet and the outlet of the data center.

8. The cooling method of claim 7, wherein providing the plurality of pumps comprises:

providing a first pump located at the inlet of the chiller unit;

providing a second pump on the second pipeline and located between the intersection of the eleventh pipeline and the second pipeline and the intersection of the second pipeline and the fourth pipeline; and providing a third pump located at the outlet of the cooling tower.

* * * * *